(12) United States Patent
Possin et al.

(10) Patent No.: US 6,707,046 B2
(45) Date of Patent: Mar. 16, 2004

(54) OPTIMIZED SCINTILLATOR AND PIXILATED PHOTODIODE DETECTOR ARRAY FOR MULTI-SLICE CT X-RAY DETECTOR USING BACKSIDE ILLUMINATION

(75) Inventors: George Edward Possin, Niskayuna, NY (US); David Michael Hoffman, New Berlin, WI (US); Bing Shen, Cary, NC (US); Steven Jude Duclos, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 65 days.

(21) Appl. No.: 10/035,266

(22) Filed: Jan. 3, 2002

(65) Prior Publication Data

US 2003/0122083 A1 Jul. 3, 2003

(51) Int. Cl.$^7$ .................................................. G01T 1/24
(52) U.S. Cl. .................................. 250/370.11; 250/367
(58) Field of Search ....................... 250/370.11, 370.09, 250/367, 368; 438/64, 66, 73, 80, 98

(56) References Cited

U.S. PATENT DOCUMENTS

| 4,906,850 | A | * | 3/1990 | Beerlage | 250/370.09 |
|---|---|---|---|---|---|
| 5,208,460 | A | | 5/1993 | Rougeot et al. | |
| 5,773,829 | A | * | 6/1998 | Iwanczyk et al. | 250/367 |
| 6,091,795 | A | * | 7/2000 | Schafer et al. | 378/19 |
| 6,362,480 | B1 | * | 3/2002 | Peter et al. | 250/366 |
| 6,393,092 | B1 | * | 5/2002 | Yoshida | 378/19 |
| 6,473,486 | B2 | * | 10/2002 | Hoffman | 378/19 J |
| 6,534,773 | B1 | * | 3/2003 | Iwanczyk et al. | 250/370.11 |

FOREIGN PATENT DOCUMENTS

EP          911881 A2  *  4/1999

* cited by examiner

Primary Examiner—Christopher W. Fulton
Assistant Examiner—Tania Courson
(74) Attorney, Agent, or Firm—Jean K. Testa; Patrick K. Patnode

(57) ABSTRACT

A photodiode detector array includes a layer of intrinsic semiconductor material having a first doped layer on a first surface of a first conductivity type and an array of photodiodes having respective doped regions on a second surface of an opposite conductivity type. Electrical contacts on the second surface respectively contact the doped regions and convey electrical signal therefrom. Conductors extend from the electrical contacts to convey the electrical signals to output terminals of the array. A scintillator is optically coupled to the layer of intrinsic semiconductor material at the first surface thereof and can be pixelated, with individual scintillator elements aligned with and corresponding to the doped regions of the photodiode. The photodiode detector array can be mounted to a rigid printed wiring board or to a flat bottom wall surface of the scintillator.

26 Claims, 11 Drawing Sheets

OPTIMIZED SCINTILLATOR AND PIXILATED PHOTODIODE DETECTOR ARRAY FOR MULTI-SLICE CT X-RAY DETECTOR USING BACKSIDE ILLUMINATION

BACKGROUND OF THE INVENTION

This invention relates to a multi-slice computed tomography (CT) x-ray detector and, more particularly, to a photodiode array activated by backside illumination affording access for electrical connections to individual photodiodes at the opposite, usual front side of the array, while maintaining desired values of the modulation transfer function (MTF) of the detector, enabling the assembly of large two-dimensional detector arrays.

Radiation imaging systems employing such detectors are widely used for medical and industrial purposes, such as for x-ray computed tomography (CT); a typical detector may comprise an array of semiconductor photodiodes, or photodiodes, used to detect light or other ionizing radiation, having attached scintillators. To increase image quality and speed of such detectors, a large number of individual pixels is required. Present technology uses on the order of 1000 to 4000 individual pixels with a respective amplifier per pixel. Some implementations (e.g., GE LIGHTSPEED™ scanners) have configurable detectors wherein plural, respective signal currents from multiple individual photodiodes can be combined for further processing in a single amplifier channel. This arrangement permits the detection area for an individual pixel to be varied, using externally controlled electrical switches. However, as the number of individual amplifier channels and respective pixels is further increased to a desirable number, e.g., ~12000 or more, providing all necessary electrical connections becomes complex and cumbersome.

Present technology uses a single amplifier per photodiode, and thus per pixel, since this affords high data rates and high signal quality. Moreover, present technology provides connections from the photodiodes to the respective amplifiers at the edges of the detector arrays, using a flexible interconnector structure, such as a flexible circuit board ("flex") that brings all of the amplifier connections to edges of the photodiode arrays. However, as the number of amplifier channels increases, the density of the interconnector structures increases to an unattractively high level from the standpoint of complexity, ease of fabrication, and performance. This structure also places some practical fabrication limitations on expanding the area of the array.

It is desirable to provide an imaging device that permits increasing the density of photodiode detection elements in a photodiode array chip and, as well, the total number of photodiodes and the area of the array.

BRIEF SUMMARY OF THE INVENTION

In one representative embodiment, a photodiode detector array is provided that includes a layer of intrinsic semiconductor material having first and second opposite main surfaces, a first doped layer at the first surface of a first conductivity type, and an array of photodiodes on the second main surface comprising respective doped regions of a second conductivity type. The detector array further includes electrical contacts coupled to the second main surface, respectively contacting the doped regions and adapted to convey electrical signals therefrom. Conductors are coupled to the electrical contacts, and a scintillator is optically coupled to the first main surface of the intrinsic semiconductor material. It should be appreciated that intrinsic semiconductor material comprises a lightly doped semiconductor of the first conductivity type, and the use of the term intrinsic describes such a lightly doped semiconductor.

In another representative embodiment, a method of fabricating a photodiode detector array for use in an x-ray detector is provided. The method comprises the steps of forming a layer of intrinsic semiconductor material on a substrate. The layer of intrinsic semiconductor comprises a first surface and a second surface where the first surface is positioned opposite from the second surface. A first doped layer is provided and positioned at the first surface. The first doped layer comprises a first conductivity type. A plurality of second doped regions is provided and positioned at the second surface. The second doped region comprises a second conductivity type. The first conductivity type is opposite to the second conductivity type where the plurality of second doped regions detects radiation incident on the first surface and outputs electrical signals corresponding to the incident radiation. Each of a plurality of electrical contacts is connected to a different one of the plurality of second doped regions. The plurality of electrical contacts extends along the second surface. A first plurality of conductive electrode pads is located on a first board surface of a printed wiring board. Each of the first plurality of conductive electrode pads is aligned with a different one of the plurality of second doped regions, and the printed wiring board is positioned proximate to the second surface. A second plurality of conductive electrode pads is located on a second board surface of the printed wiring board. The second board surface is located opposite from first board surface, and each of the second plurality of conductive electrode pads is connected to a different one of the first plurality of conductive electrode pads. The layer of intrinsic semiconductor material is positioned with the second surface connected to the first board surface, and each of the plurality of electrical contacts is aligned with a different one of the first plurality of conductive electrode pads. A conductive epoxy is applied between each of the plurality of electrical contacts aligned with the first plurality of conductive electrode pads, and each of the plurality of electrical contacts is electrically connected to a different one of the first plurality of conductive electrode pads.

DETAILED DESCRIPTION OF THE INVENTION

Figure 1:
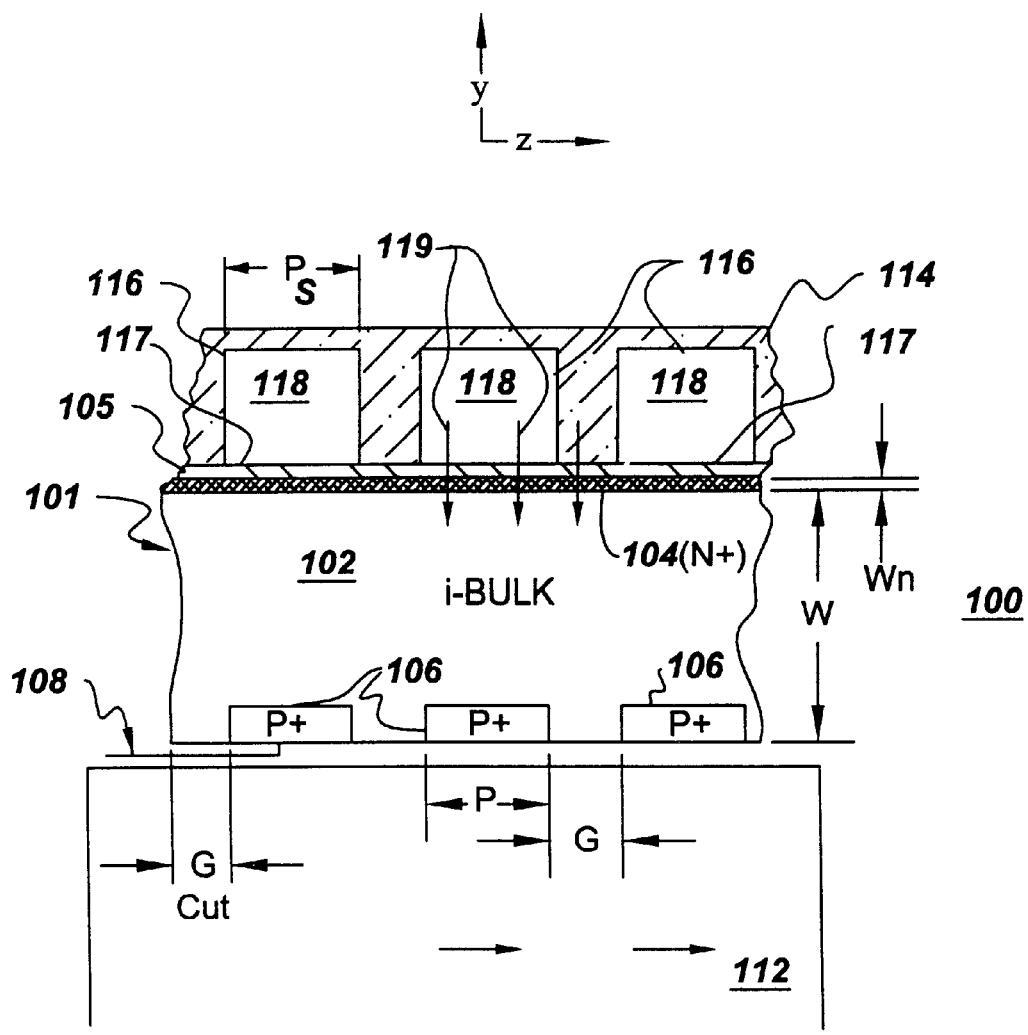
FIG. 1 is a schematic diagram of a multi-slice CT x-ray detector employing a photodiode array chip using backside illumination in accordance with the present invention.

As shown in FIG. 1, a multi-slice CT x-ray detector 100 comprises an i-bulk (intrinsic) semiconductor layer 102 formed on substrate 112. While disclosed specifically in relation to x-ray detection, the structure described herein is suitable for detection of various forms of high energy ionizing radiation, including, for example, gamma rays, high energy electron (beta) rays or high energy charged particles (as are encountered in nuclear physics and space telescopes). Therefore, it should be appreciated that the present invention is not limited to the specific disclosed embodiment of x-ray detection.

The photodiode array chip 101 comprises an i-bulk (intrinsic) layer 102 having an n+ doped layer 104 at the upper main surface, as seen in FIG. 1, and p+ doped regions 106 at the opposite, lower main surface of the i-bulk layer 102, supported on a substrate 112. It is to be understood that additional layers, e.g., an oxide layer, can be formed additionally on either or both of the aforesaid upper and lower main surfaces (the latter terms being used, as well, to refer generically to the outermost surfaces of the layer 102). Light represented by arrows 119 and emitted from a scintillator 114, and more particularly from individual scintillator elements 116 thereof having respective exit windows 117 respectively associated, and aligned (that is, disposed so that rays emanating from window 117 and perpendicular to upper surface of layer 102 will impinge on the bordering p+ region) with corresponding doped regions 106 representing corresponding photodiodes, is incident on and enters the photodiode array chip 101 from the upper, n+doped layer side.

It is noted that the arrangement, shown in FIG. 1, is "inverted" with respect to the conventional arrangement of a radiation detecting array in which the heavily doped regions corresponding to the pixels (e.g., as would correspond to regions 106 in FIG. 1) are disposed adjacent to the surface of the chip 101 through which radiation enters the array.

Figure 2:
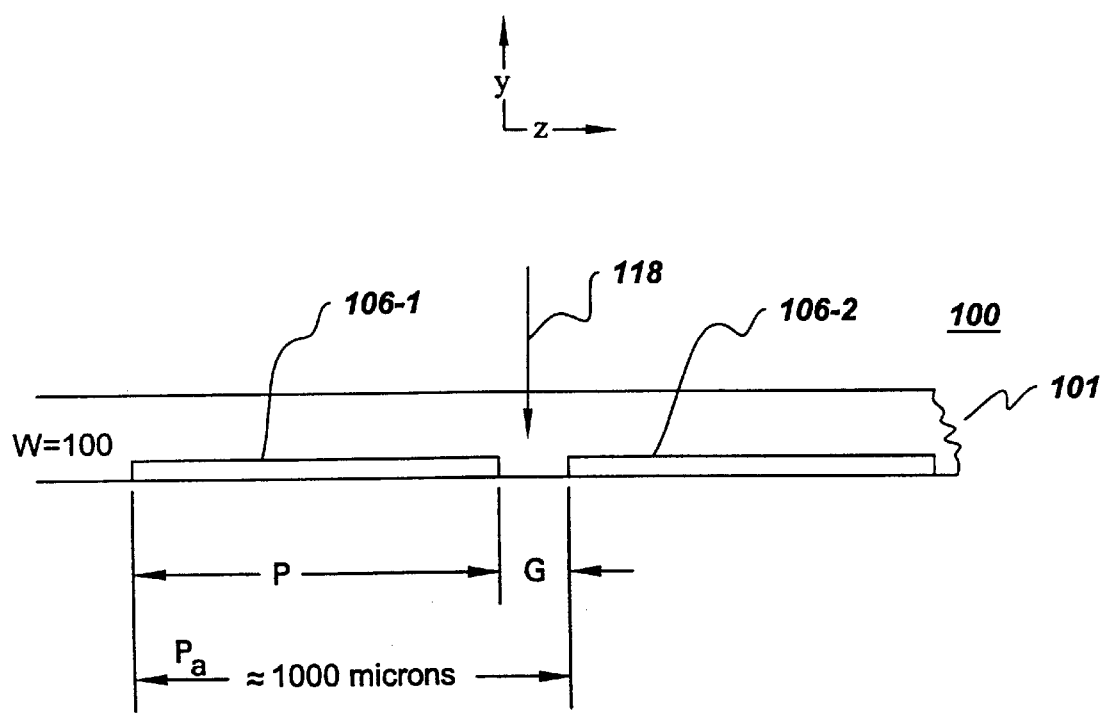
FIG. 2 illustrates a portion of the photodiode array chip of FIG. 1, in an enlarged scale in the lateral (Z) direction but a decreased scale in the vertical (X) direction relative to the structure of FIG. 1.

In FIG. 2, a portion of the detector 100 in FIG. 1, is drawn to approximate, scaled relative dimensions for a chip thickness (W) of about 100 microns and an array pitch (Pa) (length of pixel (P) plus the length of the gap (G) between adjacent edges of the doped regions 106) of about 1000 microns. The array pitch (Pa) is also termed pixel pitch. In one embodiment, typical dimensions of components of the structure in FIGS. 1 and 2 are provided in the following Table 1 in which the dimensions of W, G and P are in the X-direction as shown in FIG. 1.

TABLE 1

| Dimensions | |
|---|---|
| W(Intrinsic silicon (Si) layer 102 thickness-i.e., chip thickness) | ~100 microns |
| Wn(N + layer 104 depth) | ~0.5 microns |
| P (p + region lateral dimension) | ~762 microns |
| G (gap between p + regions) | ~262 microns |
| Ps (scintillator element lateral dimension) | ~910 microns |

Figure 3:
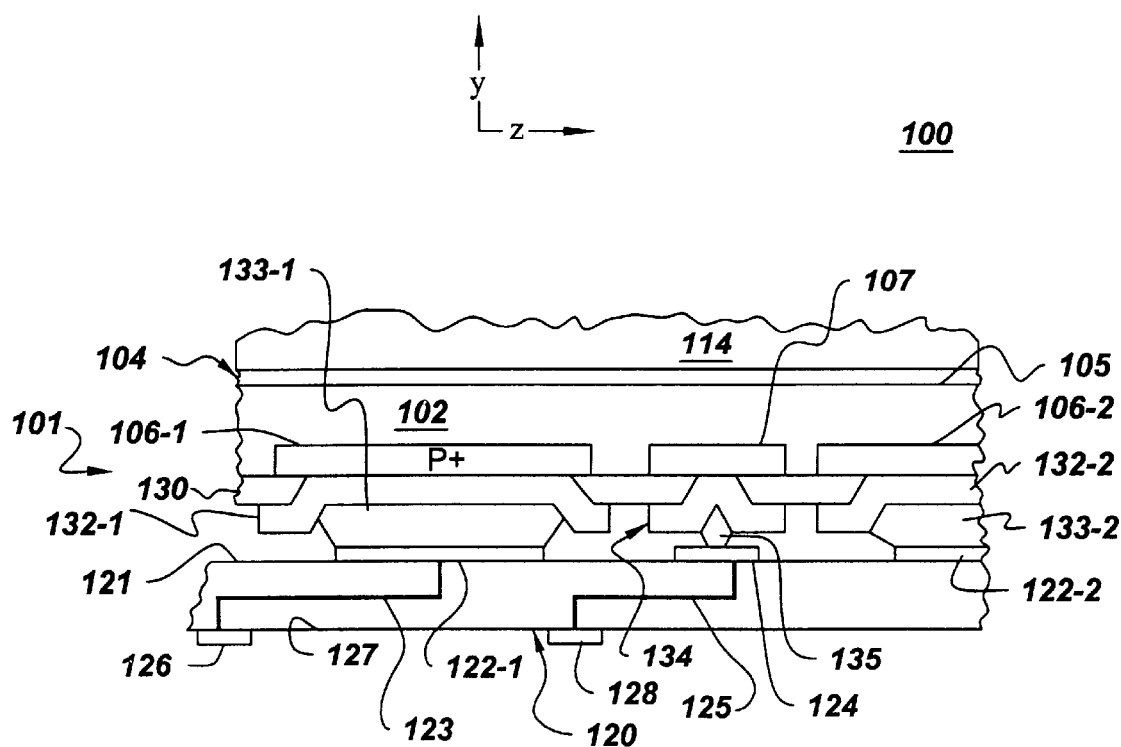
FIG. 3 is a fragmentary elevational cross-sectional view of a multi-slice CT x-ray detector in accordance with a representative embodiment of the present invention, illustrating a arrangement of electric connections to the photodiode array chip.

Respective, individual connections to the (p+) doped regions 106 are schematically indicated by a conductor 108 connected to the left-most p+ region 106 in FIG. 1. As shown in FIG. 3, one embodiment of electrical connections of a CT x-ray detector 100 is provided.

The photodiode array chip 101, due to its inverted configuration relative to the conventional photodiode array chip, has a potential problem of not affording adequate spatial resolution, known as the "modulation transfer function" (MTF) which is a measure of the spatial resolution, or cross-talk, in a pixelated detector. More particularly, a typical hole generation depth (i.e., in the intrinsic-bulk layer 102, below the junction with the n+ layer 104) is about 2 microns for the dominant 610 nm wavelength light from the scintillator 114. The inverted orientation of the structure permits a lateral spread of holes within the intrinsic layer 102 before collection of the holes by the p+ photodiodes on the other (i.e., the bottom, or lower) side of the layer 102. As used herein, "upper," "lower," "top," "bottom" and the like are used to delineate relative location of components in the drawings and does not imply any operational limitations or orientations.

With reference to FIGS. 1 and 2, it can be seen that, given the relative distances involved, light incident on chip 101 p+ doped region 106-1 of one photodiode will be unlikely to produce a signal in the p+ doped region 106-2 of the adjacent photodiode. Lateral diffusion of holes from the point of incidence on chip 101 would be approximately of the same magnitude as the thickness $W_n$ of the n+ doped layer 104. Hence, for the example dimensions specified in Table 1, the MTF for the inverted structure of the invention is essentially unchanged compared to conventional detector design. Based on these analyses, it is possible to increase the intrinsic layer thickness to about 200 microns or more before the MTF begins to degrade, which is relevant to fabrication considerations, as later discussed.

In FIG. 3, an n+ doped region 107 is disposed in the photodiode array chip 101, between two adjacent p+ doped regions 106-1 and 106-2. A patterned dielectric layer 130 has mounted therein electrical contacts 132-1 and 132-2 disposed in electrical contact with the p+ doped regions 106-1 and 106-2, respectively, and a further electrical contact 134 disposed in electrical contact the n+ doped region 107. Doped region 107 and its associated electrical contact 134 provide a cathode contact which may suffice for all photodiodes of the photodiode array chip 101. Alternatively, two or more such n+ doped regions 107 and associated contacts 134 may be incorporated in the photodiode array chip 101. In essence, doped zone 107 provides an n+ zone contact through intrinsic layer 102 to the n+ layer 104 which effectively serves as a ground plane for the photodiode array chip 101.

A printed wiring board (PWB) 120, or similar substrate, has large (i.e., corresponding in lateral dimensions to overlying components to which contact is to be made) metal pads 122 and 124 on a first, upper surface 121 of the PWB 120. Conductive elements 133-1, 133-2 and 135 respectively connect the metal pads 122-1, 122-2 and 124 to the corresponding doped regions 106-1, 106-2 and 107. Conductive elements 133-1, 133-2 and 135 may be formed of patterned conductive paste or solder, or by a uniform, continuous layer of a conductive adhesive with vertically (i.e., Y direction, in FIG. 3) conductive characteristics (i.e., which affords no lateral, or Z-direction, of conduction). Respective electrical connections 123 and 125 to the pads 122 and 124 are routed through the PWB 120 to respective metal pads 126 and 128 on a second, lower surface 127 of the PWB 120. The metal pads 126 and 128 can then be interfaced to readout amplifiers using standard connector techniques and devices, such as metal-to-metal pressure connectors or anisotropic elastomeric films.

Because the intrinsic silicon photodiode layer 102 of the photodiode is relatively thin, having a thickness between about 100 microns and about 200 microns (but which could be made thicker, e.g., 400 microns, for a medical CT, albeit with some degraded image quality), a support structure is required for the layer 102 on at least one of its surfaces. Wiring board 120, as shown in FIG. 3, is a suitable support structure. In conventional photodiode array structures the silicon thickness in the chip is ~500 microns, which provides mechanical strength during processing.

In another embodiment, the photodiode array chip 101 can be bonded to, and thus supported by, the scintillator 114 by an optical coupling adhesive layer 105. The PWB 120 (or, alternatively, a flex connector) is then attached to the dielectric layer 130 on the lower surface of the intrinsic layer 102, using a conductive epoxy, to complete electrical connections between the metal pads 122-1, 122-2 and 124 and the electrical contacts 132-1, 132-2 and 134, respectively. The arrangement in which the scintillator block 114 provides the structural support reduces mechanical requirements on the PWB 120 and serves to reduce costs.

Figure 4:
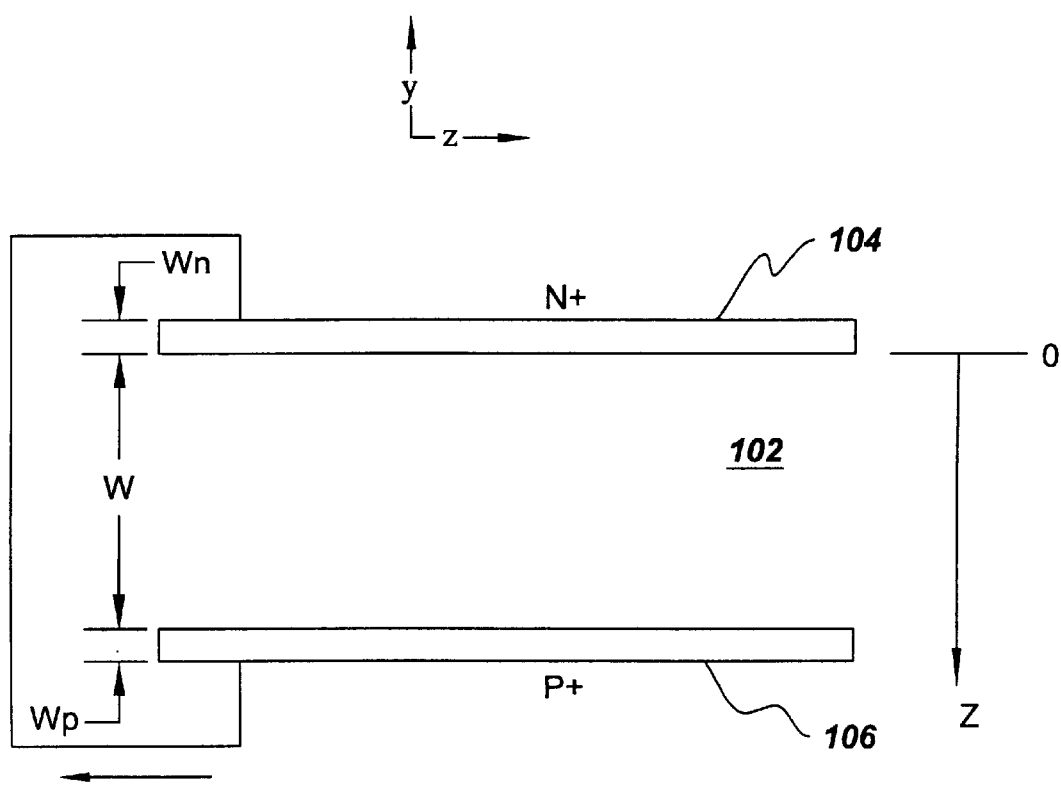
FIG. 4 is schematic diagram of a structure in accordance with one representative embodiment of the present invention for analyzing the effect of light being incident on the opposite side of a photodiode array chip, relative to the norm.

In FIG. 4, a one dimensional (1-D) detector, representing a single photodiode element of the array 101, is provided for an analysis of the effect of the light being incident on the photodiode array from the opposite side of the detector, relative to a conventional configuration. The analysis is performed by solving the minority carrier diffusion equation for carriers generated at a variable depth Z in the intrinsic layer 102, as shown in FIG. 4. The probability ($P_{loss}$) that a minority carrier (hole) generated at a depth Z will not contribute to the photocurrent (loss fraction) is:

$$P_{loss}(Z,W,Lp)=1-cosh(z/Lp)/cosh(W/Lp) \quad (1)$$

wherein Lp is the minority carrier diffusion length in the N layer. For a high quality photodiode process, Lp~1000 microns or larger. As provided hereinabove and shown in FIGS. 1, 4, 5 and 7–8, W represents the chip thickness.

The polarities within the photodiode array of the present invention, as shown in the preceding FIGS. 1 to 4, are not limiting and the opposite respective polarities may be employed in the alternative. In such an alternative design, light would be incident from the p+ side and progress through a lightly doped layer p-type silicon layer to n+ pixel photodiodes.

Figure 5:
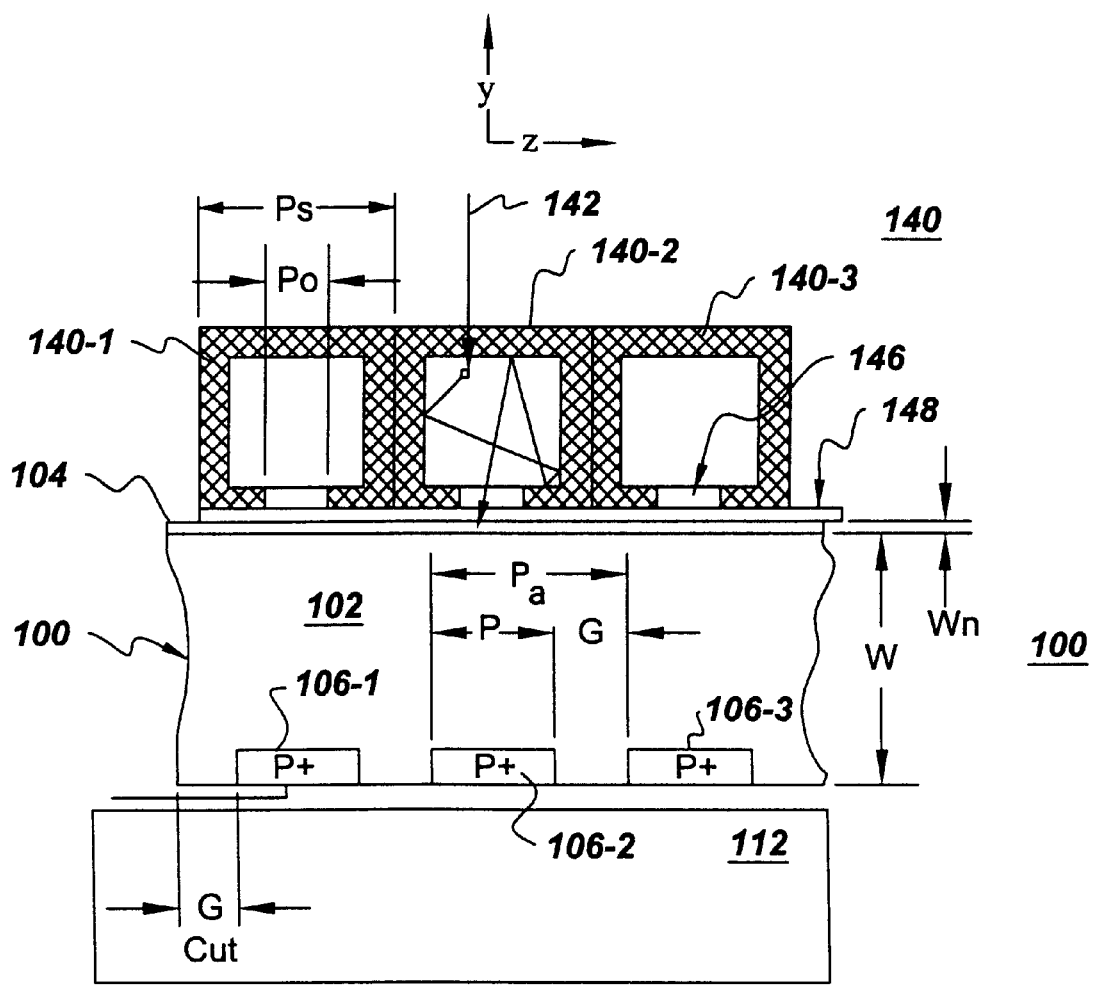
FIG. 5 is a schematic and cross sectional elevational view of a scintillator, useable with each of the multi-slice CT X-ray detector embodiments of the present invention, having a structure which restricts the level of cross talk between photodiodes of a photodiode array chip coupled thereto, permitting improved characteristics of enlarged arrays.

In FIG. 5, a scintillator 140 is provided that is useable with the detector arrays 101, and the scintillator 140 further has structure that restricts the level of cross talk between the photodiode p+ doped regions 106. More particularly, scintillator 140 is shown assembled with a multi-slice CT x-ray detector 100 having the n+ incident geometry (that is, light is incident on the array through n+ layer 104) as shown in FIG. 1. Scintillator 140 has plural scintillator elements 140-1 and 140-2, 140-3 of a width Ps and arranged at a corresponding pitch corresponding to the diode array pitch (Pa), and aligned with, the photodiodes of the photodiode chip array 101 as defined by the p+ regions 106-1, 106-2, 106-3, etc. The walls of each scintillator element, are formed of an optical reflector material and the bottom wall of each includes an optically transparent exit window 146 of a width dimension (Po) that is smaller than the lateral (Z) dimension "Ps" of the respective scintillator elements. The aperture width (Po) of the scintillator elements 104-1, 104-2, 140-3 is also termed scintillator exit diameter. An illustrative x-ray photon 142 is shown at a point of absorption in scintillator pixel 140-2 where it is converted to multiple light beams, or paths of photons, of which there is shown an illustrative light beam 144 which undergoes a limited number of multiple reflections within the interior of the scintillator pixel 140-2 before exiting through the exit window 146. The light beams are not required to be specular and, typically, the light beams instead are diffused, consistent with light photons being emitted in all directions. Hereinafter, however, illustration of an individual and specular light beam is adopted for convenience of illustration and discussion. The scintillator 140 is adhered to the detector array 100 by a layer 148 of transparent optical coupling material through which the light beam passes and then is incident on the n+ layer 104 of the array 101, as discussed in connection with FIG. 1 hereinabove.

Cross talk (MTF degradation) is most likely when light is incident near the edges of the p+ regions 106 or in the gap between the p+ regions. However, due to the aperture width (Po) of the window 146, which restricts the exiting light substantially to the central portions of the p+ regions 106 corresponding to the respective scintillator elements 140, MTF degradation is reduced, enabling higher density in the photodiode arrays (that is, the gap (G) between respective P+ regions 106 can be reduced) and thus provides improved resolution of x-ray images. The embodiment shown in FIG. 5 accordingly allows the thickness (W) of the silicon wafer 101 or the array pitch (Pa) of the photodiodes to be reduced below those values possible with the embodiment of FIG. 1 employing a conventional (non-apertured) scintillator 114. In other words, reducing the array pitch (Pa) improves the resolution of the display but increases the probability of cross talk; on the other hand, reducing the sized aperture width (Po) reduces the probability of cross talk. As the aperture width (Po) is reduced and all other parameters are held constant, the amount of cross talk is reduced, since the carriers generated in the silicon would have to diffuse a greater lateral distance (Z-direction) to produce cross talk.

Figure 6:
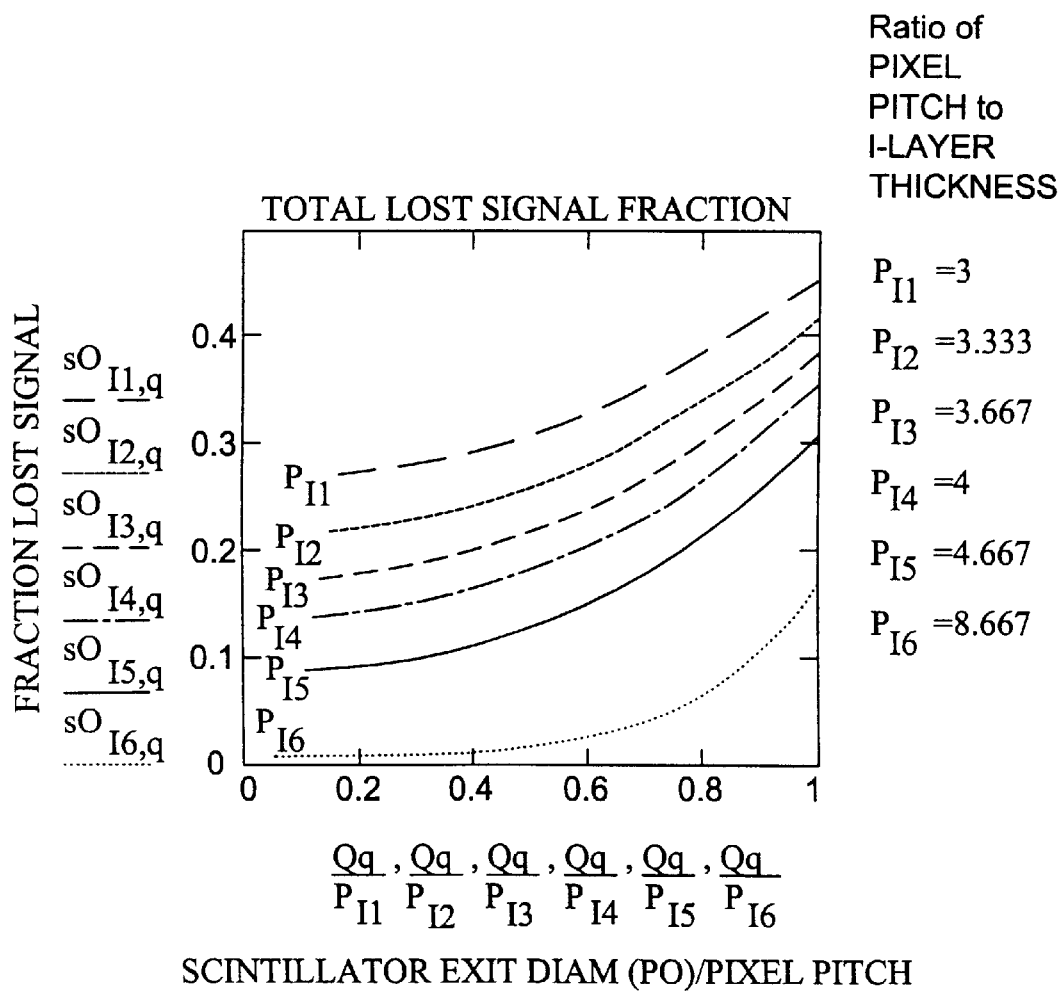
FIG. 6 is a plot of fractional lost signal values relative to the ratio of scintillator exit diameter to pixel pitch, for various different thicknesses of an intrinsic layer.

In FIG. 6, a plot of the fraction lost signal (i.e., decimal faction values) of the signal charge, or carriers, which are not collected by a given, intended photodiode but which are lost to one or more adjacent (i.e., nearest neighbors) photodiodes (presented on the ordinate) is provided with respect to differing scintillator element exit diameters (Po)/Ps, (presented on the abscissa) and for each of plural ratios $P_{f1}$ through $P_{f6}$ of the specified ratio of values designated in FIG. 6 to the right of the plot and thereby indicating the total lost signal (or carrier) fraction for each of the values $P_{f1}$ through $P_{f6}$.

Figure 7:
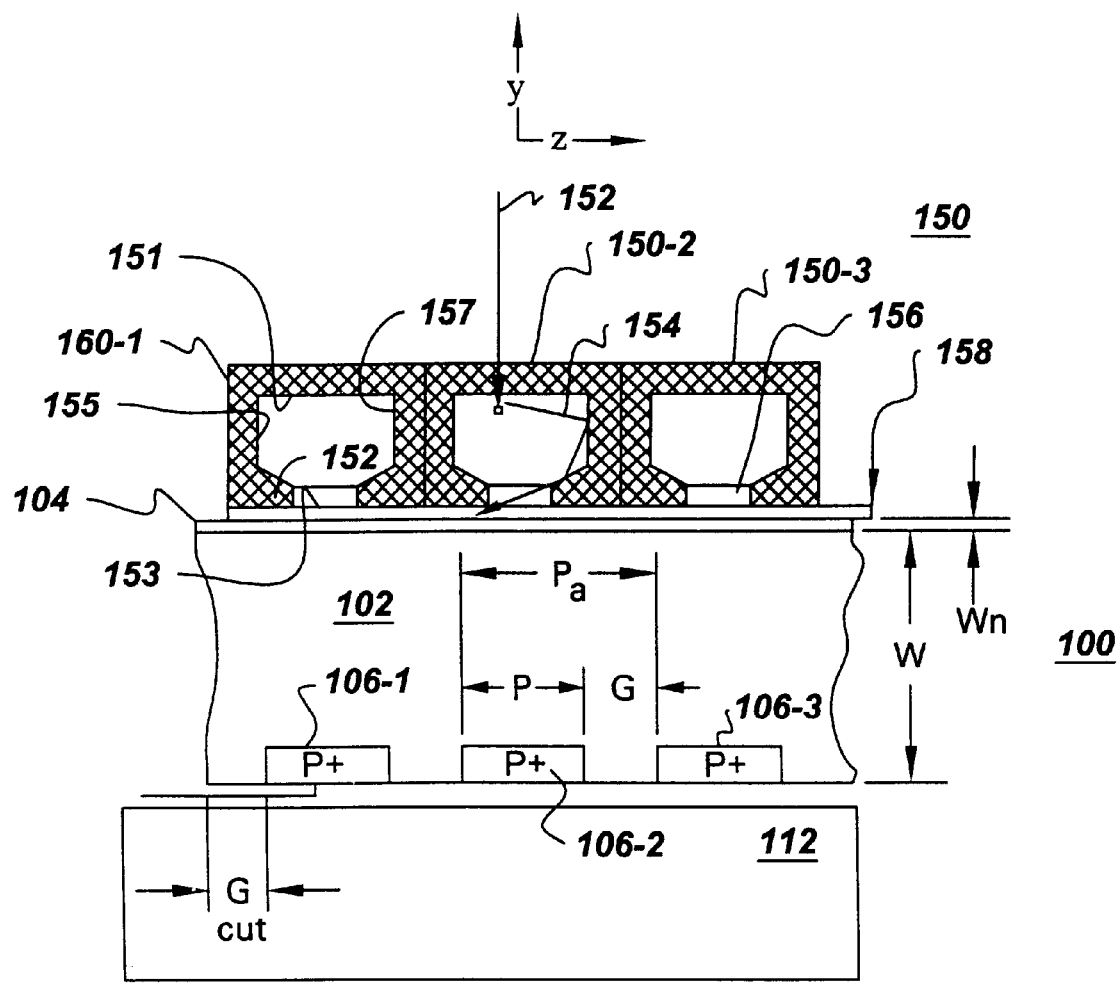
FIGS. 7 and 8 are illustrations of alternative embodiments of scintillator structures for use in the combination of FIG. 5.

As further shown in FIG. 7, the scintillator 150 includes a plurality of scintillator elements 150-1, 150-3 and 150-3.

Each of the plurality of scintillator elements 150-1, 150-3 and 150-3 include a commonly oriented top wall 151 and bottom wall 153. In one embodiment, the top wall 151 and the bottom wall 153 have a light reflective material disposed thereon. Further, each of the plurality of scintillator elements 150-1, 150-3 and 150-3 include a first sidewall 155 and a second sidewall 157 that extend from the top wall 151 to the bottom wall 153. In one embodiment, the first sidewall 155 and the second sidewall 157 have a light reflective material disposed thereon. A window 156 is positioned in the bottom wall 153, and the window 156 has a lateral dimension (width) that is less than a lateral dimension (width) of the bottom wall 156. In FIG. 7, each scintillator element 150-1, 150-2 and 150-3 includes interior bottom walls 152 (also termed portions of the first sidewall 155 and second sidewall 167) that are adjacent the bottom wall 153. The interior bottom walls 152 slope, at a predetermined angle, inwardly toward the window 156 and extend diagonally between adjacent surfaces of the first sidewall 155 and bottom wall 153 and between adjacent interior surfaces of the second sidewall 157 and the bottom wall 153. In one embodiment as shown in FIG. 7, the window 156 is composed of a layer of transparent optical material. Further, the first sidewall 155 and the second sidewall 157 of the scintillator elements 150-1, 150-2 and 150-3 slope inwardly toward, and contact and surround, a periphery of the window 156, such that a portion of the bottom wall 153 contacting and surrounding a window periphery comprises substantially a common thickness with that of the window 156.

Figure 8:
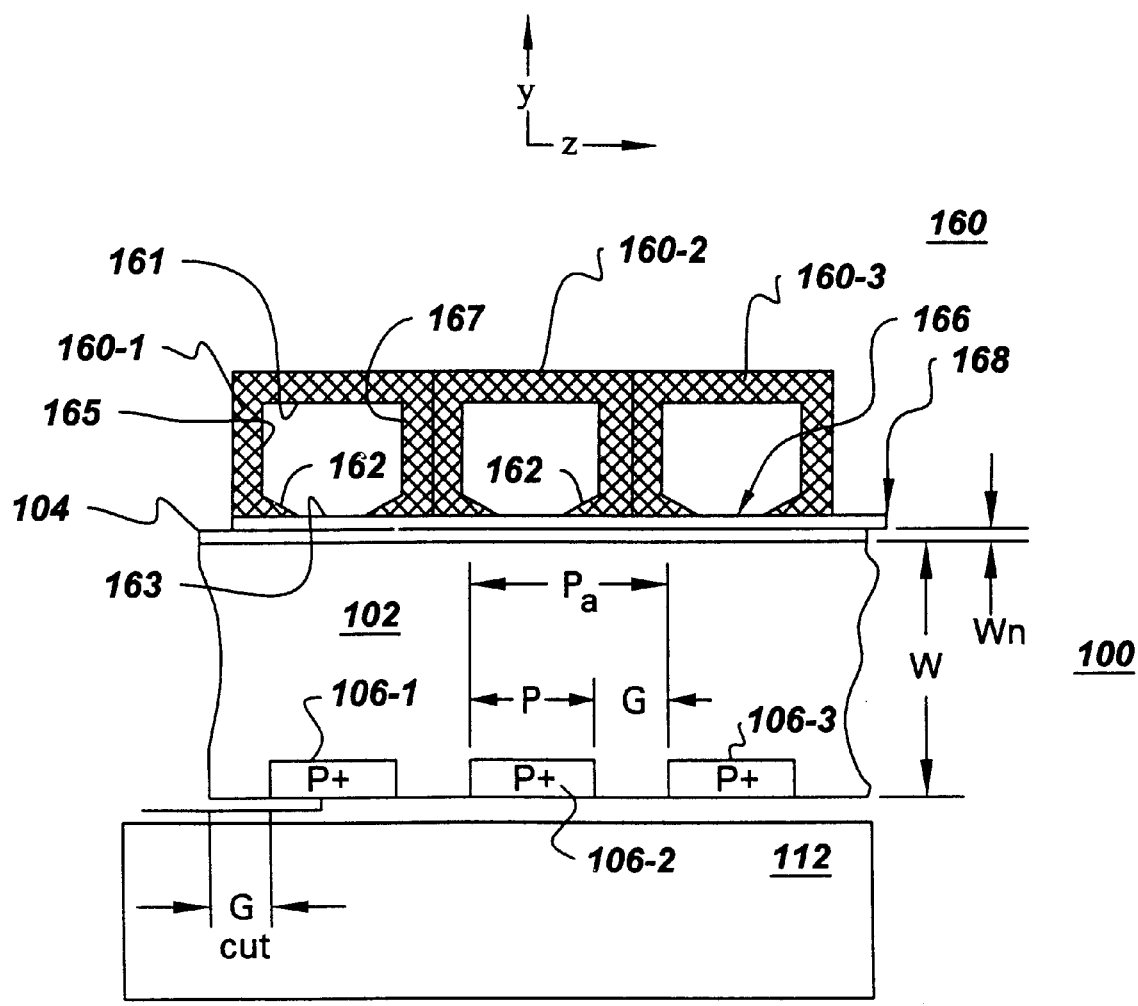

Also as shown in FIG. 8, the scintillator 160 includes a plurality of scintillator elements 160-1, 160-3 and 160-3. Each of the plurality of scintillator elements 160-1, 160-3 and 160-3 include a commonly oriented top wall 161 and bottom wall 163. In one embodiment, the top wall 161 and the bottom wall 163 have a light reflective material disposed thereon. Further, each of the plurality of scintillator elements 160-1, 160-3 and 160-3 include a first sidewall 165 and a second sidewall 167 that extend from the top wall 161 to the bottom wall 163. In one embodiment, the first sidewall 165 and the second sidewall 167 have a light reflective material disposed thereon. A window 166 is positioned in the bottom wall 163, and the window 166 has a lateral dimension (width) that is less than a lateral dimension (width) of the bottom wall 166. In FIG. 8, each scintillator element 160-1, 160-2 and 160-3 includes interior bottom walls 162 (also termed portions of the first sidewall 165 and second sidewall 167) that are adjacent the bottom wall 163. The interior bottom walls 162 slope, at a predetermined angle, inwardly toward the window 166 and extend diagonally between adjacent surfaces of the first sidewall 165 and bottom wall 163 and between adjacent interior surfaces of the second sidewall 167 and the bottom wall 163. In one embodiment as shown in FIG. 8, the first sidewall 165 and the second sidewall 167 of the scintillator elements 160-1, 160-2 and 160-3 slope, at a predetermined angle, inwardly toward, and define, a perimeter of the window 163 in a plane common with an exterior surface of the bottom wall 163.

Further, in FIGS. 7 and 8, scintillators 150 and 160, respectively, have a reduced size exit windows 156 and 166, respectively, affording the same advantages as scintillator 140 of FIG. 5, and having additional features enhancing those advantages. Particularly, the sloped interior bottom walls 152 and 162, respectively, of the scintillators 150 and 160 provide substantially diffuse reflection of the light beam 154 (as shown in of FIG. 7) for minimizing the number of reflections while directing the light beam through the exit windows 156 and 166, respectively. In one embodiment, the side wall slope angle are between twenty (20) and eighty (80) degrees in relation to the plane of the exit window 156 or 166 or a sidewall 155, 157 or 165, 167. The scintillator exit window 156 can be formed by a transparent optical coupler material, as in the case of the FIG. 7 scintillator 140. The scintillator 150 of FIG. 8 will achieve substantially the same reduction in the number of reflections of the light beam as occur in the case of the scintillator 150 of FIG. 7. However, the optical reflector material in the scintillator 160 of FIG. 8 is flush with the lower bottom surface of the scintillator 160, enabling a more simplified process of machining and polishing the optical reflector relative to the structure of the scintillator 150 of FIG. 7. The scintillators 150 and 160 are coupled to a detector 100, as in the case of FIG. 5, by respective layers 158 and 168 of transparent optical coupler material.

However, as the array pitch (Pa) decreases or the chip thickness W increases, the amount of cross talk, caused by light incident near the doped regions 106 or in the gap (G) between doped regions 106 will increase. In one embodiment, total cross talk is defined by an experiment where radiation is incident on only one pixel. In another embodiment, total cross talk is the ratio of the sum of the signals on all adjacent pixels to the sum total of the signals on all pixels, including an illuminated pixel. By confining the light emitted from the scintillator to a region centered on the respective doped regions 106, the amount of cross talk is reduced. For an array pitch on the order of ~1 mm, the desirable value of chip width to provide acceptably low cross-talk with a conventional scintillator is less than 150 microns, which presents processing difficulties. With a scintillator with the window structure as described above, a chip thickness of W~500 microns or more may be employed with an acceptable amount of cross talk. In one embodiment, an acceptable level of cross talk is less than about fifty (50) percent. In another embodiment, an acceptable level of cross talk is less than about ten (10) percent. In even another embodiment, standard silicon wafer thickness is 300 to 600 microns.

Figure 9:
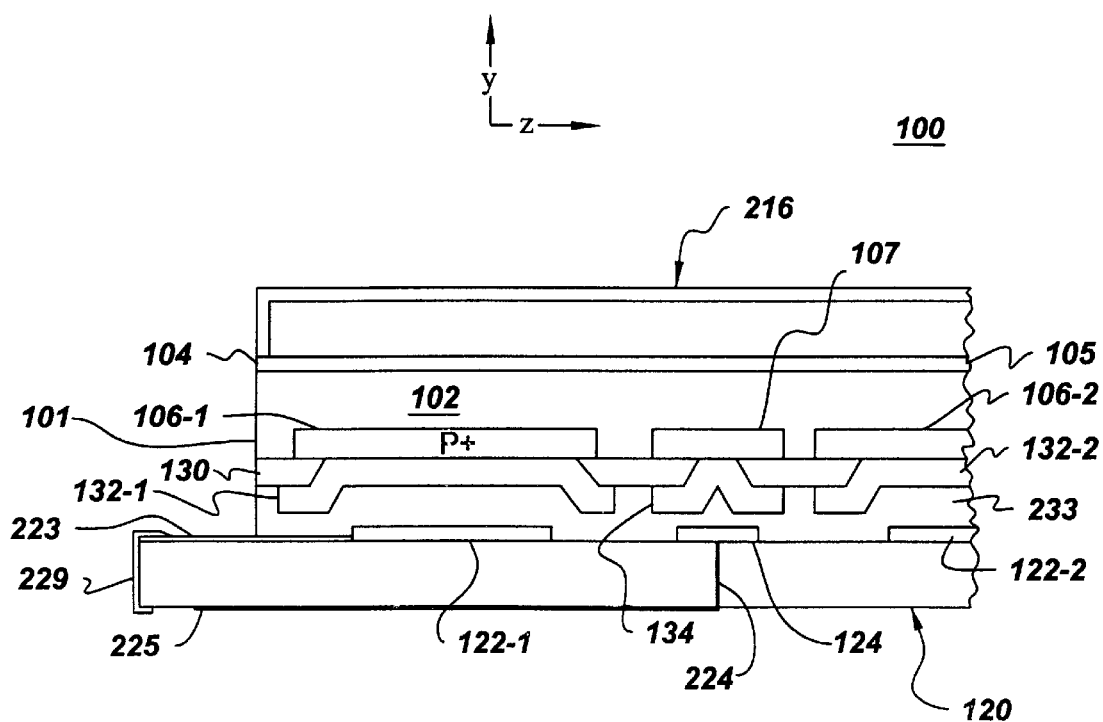
FIG. 9 is a fragmentary elevational cross-sectional view of a multi-slice CT x-ray detector in accordance with a second embodiment of the invention employing edge connectors.

In FIG. 9, another embodiment is provided for use with two or more CT x-ray detectors 100 that are not tiled in the z-direction. In this embodiment, connections on the back of PWB 120 are not required and, instead, the PWB 120 may be larger in the z-direction than the photodiode chip array 101 and the connections may be made at one or more laterally (Z) projecting edges of the photodiode chip array 101. In FIG. 9, elements that are similar to those of FIG. 3 are identified by identical reference numerals. However, in FIG. 9, the detector 100 comprises an interconnection arrangement using a vertically conductive layer 233, mentioned hereinabove, having vertically (Y) conductive paths and that is formed as a uniform, continuous layer between the PWB 120 and the rear, or bottom, surface of the patterned dielectric layer 130, selectively interconnecting the electrical contacts 132-1, 132-2 and 134 with the pads 122-1, 122-2 and 124, respectively. As before noted, PWB 120 is larger than the photodiode chip array 101 and is illustrated in FIG. 9 as extending laterally beyond, i.e., to the left of, the left edge of the chip array 101. A surface conductor 223, formed on PWB 120, is connected at one end to metal pad 122-1 and at its other end to an edge connector 229. Metal pad 124 is connected through an alternative path including a conductor 224, which may be a plated through-hole, and which extends from pad 124 to the bottom main surface of PWB 120, and through a conductor 225 formed thereon to a different, respective edge connector (not shown). The embodiment of FIG. 9 employs a non-pixilated, or uniform, scintillator 216 that uniformly radiates the photodiodes of the array chip 101, in contrast to the pixelated scintillator 114 of the prior embodiments. In this case, part of or all of the PWB 120 can be replaced with a flex connector. The PWB or flex may also contain all or part of the amplifiers and the digital-to-analog converters ("DAC") required for encoding the charge or current from the photodiodes.

Figure 10:
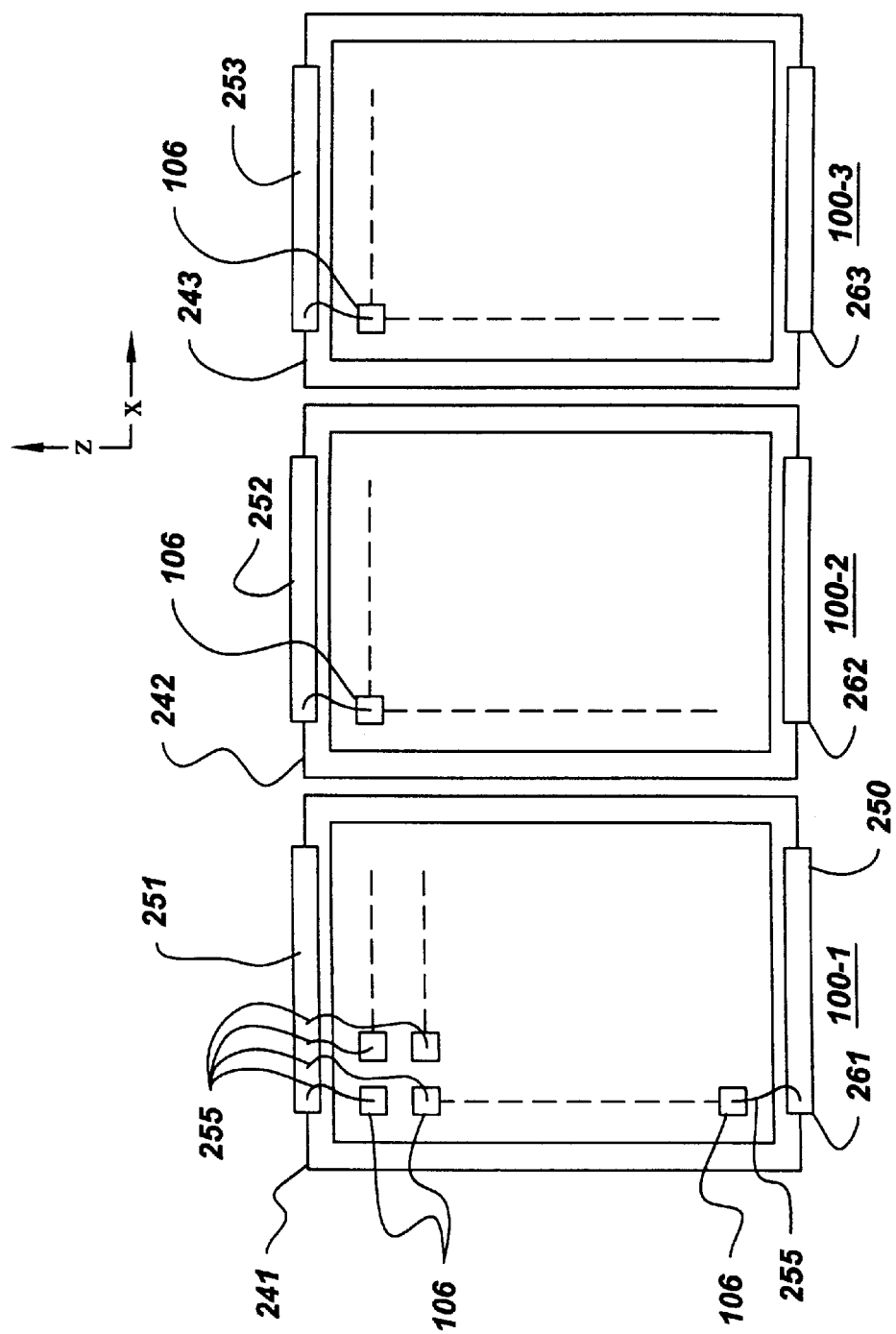
FIG. 10 illustrates an arrangement of multiple detector modules tiled in the X-direction only and employing edge connectors as in the second embodiment of the invention shown in FIG. 9.

FIG. 10 is a simplified illustration of multiple multi-slice CT X-ray detector modules 100-1, 100-2, 100-3 tiered in the X direction and arranged on respective, separate PWB's 241, 242, 243 having respective first edge connectors 251, 252, 253 along first commonly oriented sides thereof and respective second edge connectors 261, 262, 263. Along respective, second and opposite, commonly oriented sides thereof, each connected by corresponding conductors 255 to corresponding electrodes on the back surface of the detector modules 100-1, 100-2, 100-3 respectively. The capability afforded by the back mounted photodiode detector arrays of the multi-slice CT X-ray detectors 100 of the invention facilitates the electrical connection arrangements of FIG. 11, whereby the output signals of the detector modules may be captured from the backside of the photodiode array and which would be prevented by conventional such connection arrangements wherein the wires must run along the top surface of the photodiode array, between the pixels that is a very limiting requirement because there is only a finite amount of room between the pixels.

Figure 11:
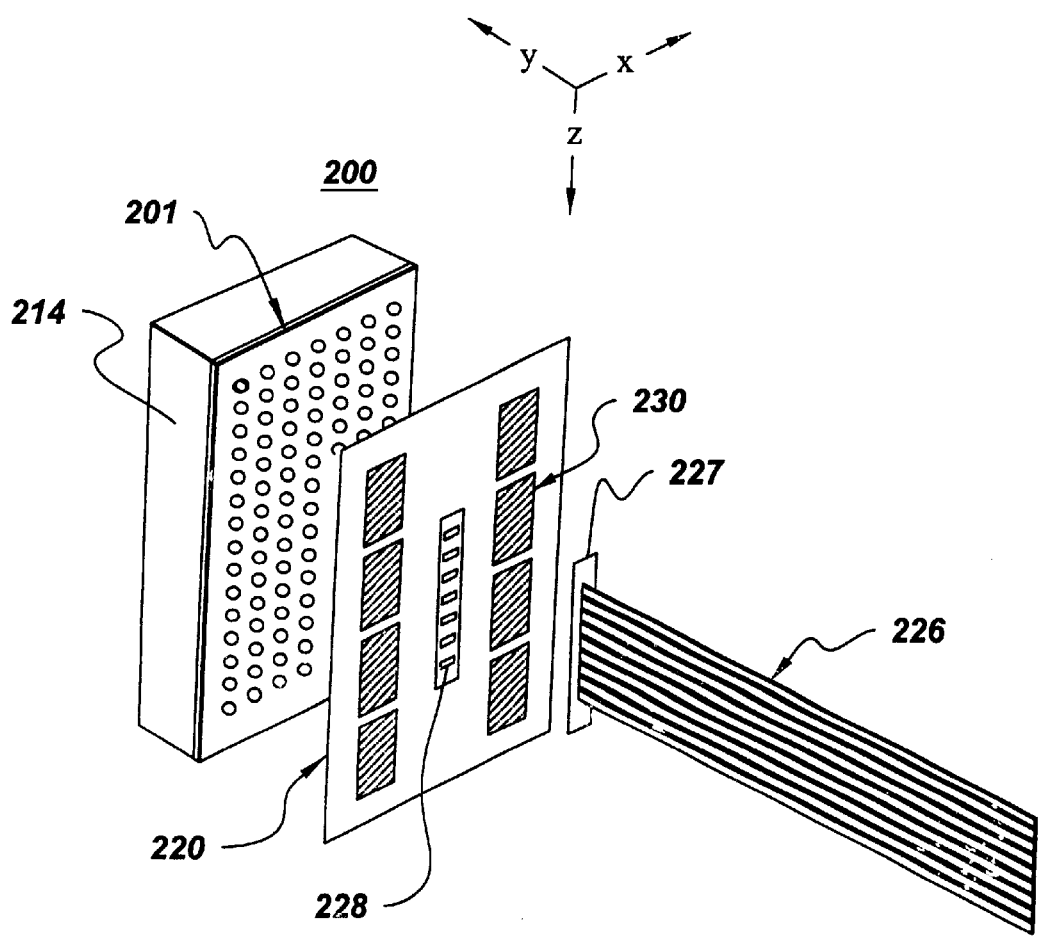
FIG. 11 is a perspective and exploded view of a multi-slice CT x-ray detector in accordance with a third embodiment of the invention, having an alternative rear connector structure.

In FIG. 11, a multi-slice CT X-ray detector 200 is provided having a photodiode chip array 201 attached to a scintillator 214, and generally corresponding to the detector 200 having the photodiode chip array 201 and scintillator 214 discussed above. The PWB 220 has eight processing chips 230 mounted thereon, each chip 230 including data acquisition circuitry (amplifiers, analog to digital circuits (ADC) and control logic) to be electrically connected to, and processing output signals from, in one embodiment, for example, 64 photodiodes of the photodiode array chip 201. In this embodiment, this configuration corresponds to a photodiode array of 512 photodiodes, or pixels.

By digitizing the photodiode output signals, amplifying same, A/D converting and then multiplexing same, the 512 pixels/photodiodes outputs are readily transmitted over an 8 bit bus flex 226 having a connector 227 which connects to a connector 228 on the flex 220.

The foregoing discussion of the invention has been presented for purposes of illustration and description. Further, the description is not intended to limit the invention to the form disclosed herein. Consequently, variations and modifications commensurate with the above teachings and with the skill and knowledge of the relevant art are within the scope of the present invention. The embodiment described herein above is further intended to explain the best mode presently known of practicing the invention and to enable others skilled in the art to utilize the invention as such, or in other embodiments, and with the various modifications required by their particular application or uses of the invention. It is intended that the appended claims be construed to include alternative embodiments to the extent permitted by the prior art.

What is claimed is:

1. A photodiode detector array for use with an x-ray detector, the photodiode detector array comprising:
   a layer of intrinsic semiconductor material positioned on a substrate, the layer of intrinsic semiconductor comprising:
      a first surface and second surface, the second surface positioned proximate to the substrate wherein the first surface is positioned opposite from the second surface;
      a first doped layer positioned at the first surface and comprising a first conductivity type;
      a plurality of photodiodes positioned at the second surface, each of the plurality of photodiodes comprising a second doped layer comprising a second conductivity type wherein the first conductivity type is opposite to the second conductivity type; and
      a plurality of electrical contacts positioned at the second surface, each respective one of said plurality of electrical contacts connected to a different one of said plurality of photodiodes;
   a scintillator connected to the x-ray detector and optically coupled to the first doped layer positioned at the first surface wherein radiation emanating the scintillator impinges on at least one of the plurality of photodiodes; and
   a plurality of conductors wherein each of the plurality of conductors is connected to a different one of the plurality of electrical contacts, the plurality of conductors extending along the second surface of the layer of intrinsic semiconductor material.

2. The photodiode detector array of claim 1 wherein said first conductivity type is n+ type and said second conductivity type is p+ type.

3. The photodiode detector array of claim 1 wherein the scintillator comprises a plurality of scintillator elements, each respective one of the plurality of scintillator elements aligned with a different one of the plurality of photodiodes.

4. The photodiode detector array of claim 3 wherein each of the plurality of scintillator elements comprises:
   a commonly oriented top wall and bottom wall, the top wall and bottom wall being substantially parallel to the first surface and second surface and having a light reflective material disposed thereon;
   a first sidewall and a second sidewall extending from the top wall to the bottom wall, the first sidewall and the second sidewall having a light reflective material disposed thereon; and
   a window positioned in the bottom wall, the window having a lateral dimension less than a lateral dimension of the bottom wall wherein the window is aligned with a respectively one of the plurality of photodiodes.

5. The photodiode detector array of claim 4 wherein each of the plurality of photodiodes have a lateral dimension in a plane parallel to the first surface and the second surface, the lateral dimension of each of the plurality of photodiodes being less than the lateral dimension of the bottom wall of each of the plurality of scintillator elements but greater than the lateral dimensions of the window of the bottom wall in each of the plurality of scintillator elements.

6. The photodiode detector array of claim 4 wherein portions of interior surfaces of the first sidewall and second sidewall of each of the plurality of scintillator elements, adjacent the bottom wall thereof, slope inwardly toward the window and extending diagonally between adjacent, respective interior surfaces of the first sidewall, second sidewall and bottom wall.

7. The photodiode detector array of claim 6 wherein:
   the window in the bottom wall of each of the plurality of scintillator elements comprises a layer of transparent optical material; and
   the first sidewall and the second sidewall of each of the plurality of scintillator element slope inwardly toward, and contact and surround, a periphery of the respective window wherein a portion of the bottom wall contacting and surrounding a periphery of the window has substantially a common thickness with that of the window.

8. The photodiode detector array of claim 6 wherein the first sidewall and second sidewall of each of the plurality of scintillator element slope inwardly toward and define a perimeter of the window in a plane common with an exterior surface of the bottom wall thereof.

9. The photodiode detector array of claim 1 further comprising an optical coupling adhesive layer positioned between the scintillator and the first doped layer and optically coupling the scintillator to the first doped layer at the first surface.

10. The photodiode detector array of claim 1 wherein the layer of intrinsic semiconductor material comprises a thickness measured between the first surface and the second surface, the thickness ranging from about 100 microns to about 200 microns.

11. The photodiode detector array of claim 1 wherein the layer of intrinsic semiconductor material comprises a thickness measured between the first surface and the second surface, the thickness being about 100 microns.

12. An x-ray detector, comprising:
a photodiode detector array comprising:
a layer of intrinsic semiconductor material comprising a first surface and second surface;
a first doped layer positioned at the first surface and comprising a first conductivity type; and
a plurality of photodiodes positioned at the second surface and each of the plurality of photodiodes comprising a second doped layer comprising a second conductivity type;
a scintillator positioned at the first surface and comprising:
a first outer surface defining a radiation input end; and
a second outer surface defining a radiation output end wherein the scintillator produces light beams exiting from the output end in response to radiation incident on the input end, the light beams exiting from the output end being incident on at least one of the plurality of photodiodes positioned at the second surface; and
a plurality of electrical contacts positioned at the second surface wherein each one of the plurality of electrical contacts being coupled to a different one of the plurality of photodiodes and the plurality of electrical contacts extending along the second surface to conveying electrical output signals of the respective photodiodes produced in response to the light beams incident upon the scintillator.

13. The x-ray detector claim 12 wherein each of the plurality of electrical contacts further comprises:
a portion of conductive material contacting a cathode region of a respective one of the plurality of photodiodes; and
a printed wiring board comprising a metal pads on a first board surface, the metal pad positioned to contact a corresponding portion of conductive material and extending through the printed wiring board to a second board surface wherein the second board surface is opposite from the first board surface.

14. The x-ray detector of claim 12 wherein the scintillator comprises a plurality of scintillator elements, each respective one of the plurality of scintillator elements aligned with a different one of the plurality of photodiodes.

15. The x-ray detector of claim 14 wherein the plurality of photodiodes are positioned in a row, each of the plurality of photodiodes being arranged at a pitch being substantially equal to P+G where P is a length of a respective one of the plurality of photodiodes in the row and G is a length of a space between adjacent photodiodes of the plurality of photodiodes in the row and wherein the scintillator comprises and a plurality of scintillator elements arranged in row and each of the plurality of scintillator elements aligned with a different one of the plurality of photodiodes and each of the plurality of scintillator elements being arranged at a pitch being substantially equal to P+G.

16. The x-ray detector of claim 15 wherein each of the plurality of scintillator elements comprises a width substantially equal to Ps, the width extending in a direction of the row wherein the width Ps is substantially equal to the pitch P+G and each of the plurality of scintillator elements comprises outer reflective walls surrounding an inner structure of scintillating material and a window positioned in the output end the scintillator, the window comprising a width dimension in a direction of the row wherein the width of the window is less than about the width Ps of each of the plurality of scintillator elements in the row direction.

17. The x-ray detector of claim 16 wherein each of the plurality of scintillator elements comprises first and second sidewalls extending from the input end to the output end of the scintillator, the first and second sidewalls comprising a reflective surface and extending toward the second surface at a predetermined angle.

18. The x-ray detector of claim 17 wherein the first and second interior sidewalls of each of the plurality of scintillator elements extend toward peripheral edges of the window.

19. The x-ray detector of claim 12, further comprising a printed wiring board connected to each of the plurality of electrical contacts the printed wiring board comprising:
a plurality of semiconductor processor chips connected to the printed wiring board, each of the plurality of semiconductor processing chips comprising:
a plurality of amplifiers, each of the plurality of amplifiers connected to a different one of the electrical contacts and receiving the outputs of a corresponding one of the plurality of photodiodes;
analog to digital circuitry connected the plurality of amplifiers; and
control logic circuitry multiplexing an output of the analog to digital circuitry and outputting multiplexed digital signals.

20. A scintillator for use with an x-ray detector, the scintillator comprising:
a plurality of scintillator elements, each of the plurality of scintillator elements comprising:
a commonly oriented top wall and bottom wall, the top wall and bottom wall having a light reflective material disposed thereon;
a first sidewall and a second sidewall extending from the top wall to the bottom wall, the first sidewall and the second sidewall having a light reflective material disposed thereon; and
a window positioned in the bottom wall, the window having a lateral dimension less than a lateral dimension of the bottom wall.

21. The scintillator of claim 20 wherein portions of interior surfaces of the first sidewall and the second sidewall of each of the plurality of scintillator elements adjacent the respective bottom wall thereof slope inwardly toward the window and extend diagonally between adjacent, respective interior surfaces of the first sidewall and bottom wall and between adjacent, respective interior surfaces of the second sidewall and the bottom wall.

22. The scintillator of claim 21 wherein:
each window comprises a layer of transparent optical material; and the first sidewall and the second sidewall of each of the plurality of scintillator elements slope inwardly toward, and contact and surround, a periphery of the respective window, such that a portion of the bottom wall contacting and surrounding a window periphery comprises substantially a common thickness with that of the window.

23. The scintillator of claim 21 wherein the first sidewall and the second sidewall of each of the plurality of scintillator elements slope inwardly toward, and define, a perimeter of the window in a plane common with an exterior surface of the bottom wall thereof.

24. The scintillator of claim 20 wherein each of the plurality of scintillator elements is arranged at a common pitch.

25. The scintillator of claim 24 wherein a portion of the first sidewall and the second sidewall of each of the plurality of scintillator elements extends from the first sidewall and the second sidewall of the respective scintillator element toward respective peripheral edges of the window.

26. The scintillator of claim 25 wherein portions of the first sidewall and the second sidewall of each of the plurality of scintillator elements extend from the respective first sidewall and the second sidewall of the respective scintillator element toward the bottom wall of the respective scintillator element at a predetermined angle.

* * * * *